United States Patent
Fuderer et al.

(10) Patent No.: US 11,639,980 B2
(45) Date of Patent: May 2, 2023

(54) MULTI-ECHO MR IMAGING WITH SPIRAL ACQUISITION

(71) Applicant: KONINKLIJKE PHILIPS N.V., Eindhoven (NL)

(72) Inventors: Miha Fuderer, Bunnik (NL); Elwin De Weerdt, Tilburg (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/613,302

(22) PCT Filed: May 25, 2020

(86) PCT No.: PCT/EP2020/064415
§ 371 (c)(1),
(2) Date: Nov. 22, 2021

(87) PCT Pub. No.: WO2020/239677
PCT Pub. Date: Dec. 3, 2020

(65) Prior Publication Data
US 2022/0229139 A1    Jul. 21, 2022

(30) Foreign Application Priority Data

May 28, 2019 (EP) .................... 19176859

(51) Int. Cl.
*G01R 33/56* (2006.01)
*G01R 33/48* (2006.01)
(52) U.S. Cl.
CPC ..... *G01R 33/5602* (2013.01); *G01R 33/4824* (2013.01)
(58) Field of Classification Search
None
See application file for complete search history.

(56) References Cited

U.S. PATENT DOCUMENTS

2007/0242866 A1   10/2007   Schmitt
2013/0249548 A1*  9/2013   Stemmer ............... G01R 33/44
                                                            324/309
(Continued)

OTHER PUBLICATIONS

International Search Report and Written Opinion from PCT/EP2020/064415 dated Sep. 1, 2020.
(Continued)

*Primary Examiner* — Rodney E Fuller

(57) ABSTRACT

The invention relates to a method of MR imaging of an object (10) positioned in an examination volume of a MR device (1). It is an object of the invention to enable fast spiral MR imaging with a defined T2 contrast. The method of the invention comprises the following steps: —generating a number of spin echoes by subjecting the object (10) to one or 5 more shots of an imaging sequence, each shot comprising an RF excitation pulse (21) followed by a number of RF refocusing pulses (22), wherein modulated readout magnetic field gradients (23, 24) are applied in each interval between successive RF refocusing pulses (22), —acquiring MR signal data, wherein each spin echo is recorded along a spiral trajectory (31-33, 41-43) in k-space which winds around the k-space origin with varying radial distance, wherein the trajectory (31, 41) of at least one spin echo has a different rate of variation of the radial distance at least in a central k-space region compared to the trajectories (32, 33, 42, 43) of the other spin echoes, and—reconstructing an MR image from the acquired MR signal data. Moreover, the invention relates to an MR device (1) and to a computer program for an MR device (1).

11 Claims, 3 Drawing Sheets

(56) References Cited

U.S. PATENT DOCUMENTS

| | | | |
|---|---|---|---|
| 2018/0092569 A1* | 4/2018 | Li | A61B 5/055 |
| 2018/0292499 A1* | 10/2018 | Meyer | G01R 33/243 |
| 2020/0182954 A1* | 6/2020 | Shen | G01R 33/56 |
| 2020/0249296 A1* | 8/2020 | Hennig | G01R 33/5617 |
| 2020/0281500 A1* | 9/2020 | Wang | G01R 33/4818 |
| 2022/0171005 A1* | 6/2022 | Röll | G01R 33/546 |
| 2022/0373627 A1* | 11/2022 | Wang | G01R 33/543 |

OTHER PUBLICATIONS

Zhiqiang L. et al., "A 2D Spiral Turbo-Spin-Echo Technique", Magnetic Resonance in Medicine., vol. 80, No. 5, Mar. 9, 2018, pp. 1989-1996, XP055641221.

Chang Y. V. et al., "3D-Accelerated, Stack-of-Spirals Acquisitions and Reconstruction of Arterial Spin Labeling MRI", Magnetic Resonance in Medicine, vol. 78, No. 4, Nov. 3, 2016, pp. 1405-1419, XP055484140.

Wang J. et al., "Single Shot Three-Dimensional Pulse Sequence for Hyperpolarized 13 C MRI", Magnetic Resonance in Medicine, vol. 77, No. 2, Feb. 24, 2016, pp. 740-752, XP055502244.

Block W. et al., "Rare Spiral T2-Weighted Imaging", Magnetic Resonance in Medicine, vol. 37, pp. 582-590, 1997.

Kerr A.B. et al., "Real-Time Interactive MRI on a Conventional Scanner", Magnetic Resonance in Medicine, vol. 38, pp. 355-367, 1997.

\* cited by examiner

MULTI-ECHO MR IMAGING WITH SPIRAL ACQUISITION

CROSS REFERENCE TO RELATED APPLICATIONS

This application is a U.S. national phase application of International Application No. PCT/EP2020/064415 filed on May 25, 2020, which claims the benefit of EP Application Serial No. 19176859.7 file May 28, 2019 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated, e.g., by means of a refocusing pulse (for example a 180° pulse). This produces an echo signal (spin echo) in the receiving coils.

To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of an image reconstruction algorithm.

Spiral imaging is a fast MR imaging technique that benefits from an efficient k-space coverage and a low sensitivity to flow artifacts. It is, however, vulnerable to inhomogeneities in the amplitude of the main magnetic field Bo, which causes blurring and degrades the image quality, particularly at high main magnetic field strengths. In spiral imaging, the MR signal is acquired along a spiral trajectory in k-space which winds around the origin of k-space with increasing ("spiral out") or decreasing ("spiral in") radial distance from the k-space origin.

Due to its efficient k-space coverage, spiral imaging can be combined advantageously with fast spin echo (FSE) imaging in order to further reduce the overall scan time (because a smaller number of excitations, i.e., "shots" of the imaging sequence is required). FSE uses a series of spin echoes generated as a train following after a single RF excitation pulse. In FSE imaging, each echo is formed by a (180°) refocusing RF pulse. The echo signal amplitude reduces due to transverse relaxation ($T_2$) from echo to echo in the train (with increasing echo number). In combination with spiral imaging, each spin echo is recorded along a spiral trajectory in k-space. The trajectories of the spin echoes of the whole echo train form a set of interleaved spirals in k-space in order to achieve an appropriate sampling of k-space to enable reconstruction of an MR image for a desired field of view and resolution. The acquisition of interleaved k-space spirals has the further advantage that the acquisition time of each interleave can be kept small such that off-resonance blurring is significantly reduced.

Because the spin echoes are recorded at different acquisition times after RF excitation, the MR signal data comprised of all recorded echoes is a mix of different $T_2$ weightings. Each spiral k-space trajectory of the train of spin echoes covers the full k-space including the region near the k-space origin which dominates the contrast of the reconstructed MR image. As a result, the reconstructed MR image has no defined $T_2$ weighting. This is a major drawback of the described FSE technique with (interleaved) spiral acquisition.

SUMMARY OF THE INVENTION

From the foregoing it is readily appreciated that there is a need for an improved MR imaging technique. It is an object of the invention to address the above-mentioned limitations and to enable fast spiral MR imaging with accurate and robust control of the image contrast, in particular with a defined $T_2$ contrast.

In accordance with the invention, a method of MR imaging of an object positioned in an examination volume of a MR device is disclosed. The method comprises the following steps:

generating a number of spin echoes by subjecting the object to one or more shots of an imaging sequence, each shot comprising an RF excitation pulse followed by a number of RF refocusing pulses, wherein modulated readout magnetic field gradients are applied in each interval between successive RF refocusing pulses, acquiring MR signal data, wherein each spin echo is recorded along a spiral trajectory in k-space which winds around the k-space origin with continuously varying radial distance, wherein the trajectory of at least one spin echo has a different rate of variation of the radial distance at least in a central k-space region compared to the trajectories of the other spin echoes, and reconstructing an MR image from the acquired MR signal data.

Like in the prior art, the trajectories associated with the individual echoes are preferably chosen to form a set of (e.g. Archimedean) interleaved spirals in k-space to achieve the required sampling of the k-space region of interest.

The spiral trajectories can either start or end at the k-space origin with continuously increasing or decreasing radial distance from the k-space origin respectively. In other words, the method of the invention can be used with both spiral-in and spiral-out acquisitions.

According to the invention, at least one (preferably exactly one) spin echo is selected to have a different, in particular smaller rate of increase or decrease of the radial distance (i.e. the speed at which the trajectory advances away from the k-space origin or approaches the k-space origin from a radially more remote starting position in k-space) compared to the trajectories of the other spin echoes. In this way, it can be achieved that the central k-space region which dominates the contrast of the reconstructed MR image, is sampled more densely at the particular acquisition time of the selected spin echo. For example the acquisition time for all spiral arms may be about equal. In another example all but one or a few spiral arms have a (much) higher radial speed in the centre region of k-space. This causes effectively that all but the one or a few spiral arms may start sampling outside of the centre region of k-space. The invention achieves that a single spiral arm covering the centre region of k-space may accurately and robustly control the intended image contrast. The sampling of the central k-space region by the selected spin echo is exploited according to the invention to obtain the MR image with a well-defined $T_2$ weighting. To accomplish this, e.g., the selected spin echo of which the k-space trajectory has a different (in particular smaller) rate of increase/decrease of the radial distance can be weighted differently (in particular stronger) than the other spin echoes in the step of reconstructing the MR image. Therein, the weighting of the acquired MR signal data may depend on the echo number and on the k-space position. To tune the desired $T_2$ weighting, the echo number in the train of echoes can be chosen appropriately for the at least one spin echo to have the deviating rate of variation of the radial distance.

The method of the invention can advantageously also be used to obtain a $T_1$-weighted MR image. To this end, the imaging sequence may comprise appropriate measures to generate $T_1$-weighting, for example a corresponding magnetization preparation sequence. In an embodiment of the invention, the trajectory of the at least one spin echo covers only the central k-space region, while the trajectories of the other spin echoes also cover a peripheral k-space region extending at a larger radial distance from the k-space origin than the central k-space region. The selected spin echo in this way focuses on the central k-space region to obtain the desired contrast. The data from the peripheral k-space regions are provided by the other spin echoes that are acquired with different $T_2$ weightings according to their respective acquisition time. This has only a minor effect on the contrast of the reconstructed MR image as the data dominating the image contrast from the central k-space region is made available by the selected spin echo which has a defined $T_2$ weighting.

In another embodiment of the invention, the trajectories of all but the at least one spin echo have a larger rate of increase of the radial distance in the central k-space region than in the peripheral k-space region. This embodiment gives all but the at least one spin echo a particular low sampling density in the k-space center. The signal data from the central k-space region are solely provided by the at least one spin echo which has a lower rate of increase of the radial distance in the central region of k-space compared to the other spin echoes. In this way, again, an MR image with a well-defined $T_2$ weighting can be obtained. This embodiment has the advantage that the k-space sampling density can be kept more or less constant over the whole k-space.

The method of the invention described thus far can be carried out by means of a MR device including at least one main magnet coil for generating a uniform static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing a MR image from the received MR signals. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
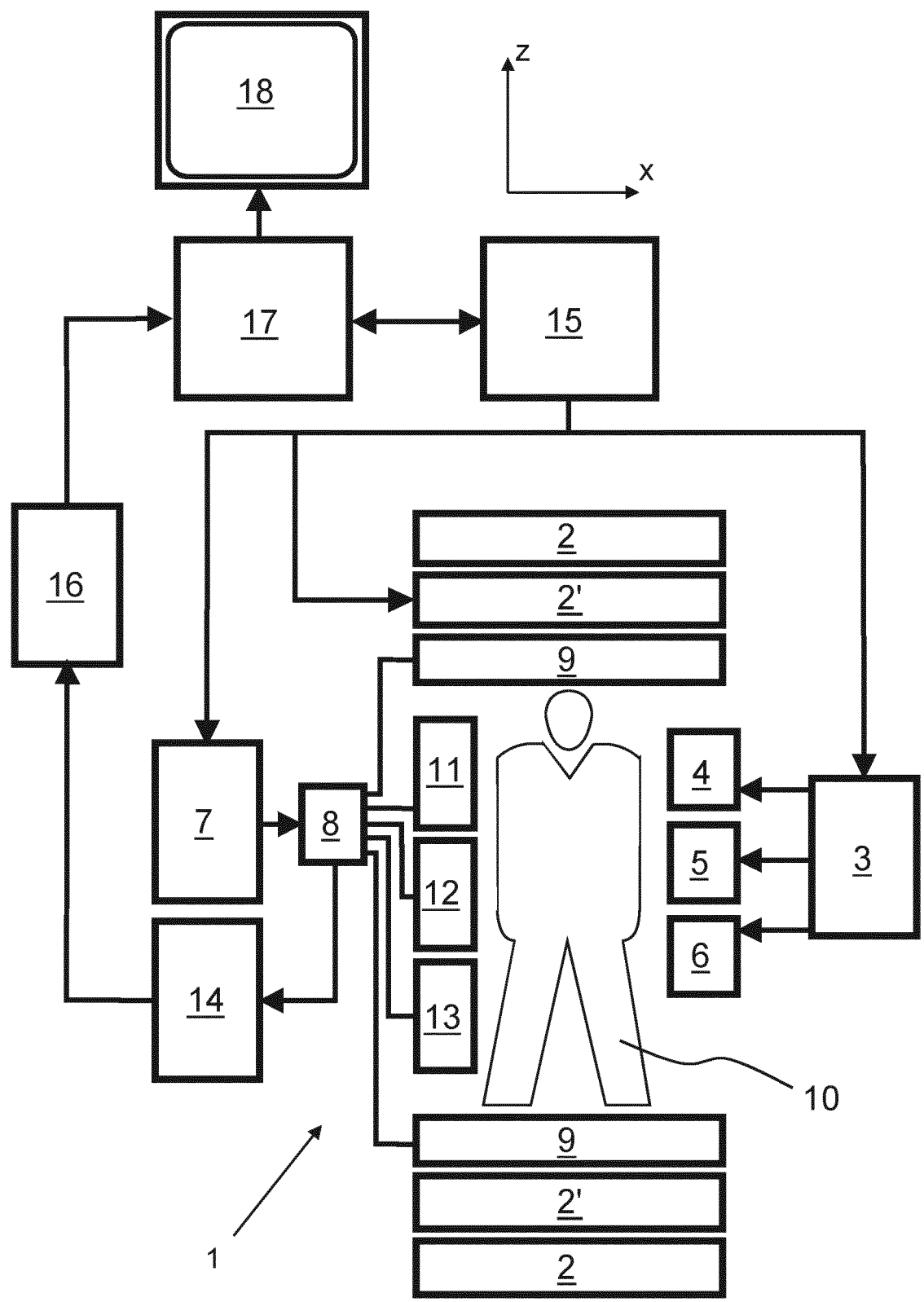
FIG. 1 shows a MR device for carrying out the method of the invention.

With reference to FIG. 1, a MR device 1 is schematically shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences. For the selected sequence, the receiver 14 receives a single or a plurality of MR signals in rapid succession following each RF excitation pulse. A data acquisition system 16 performs analog-to-digital conversion of the received signals and converts each MR signal to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The MR device 1 is arranged, e.g. by appropriate programming of the host computer 15 and the reconstruction processor 17, to perform the imaging method of the invention as described herein above and in the following.

Figure 2:
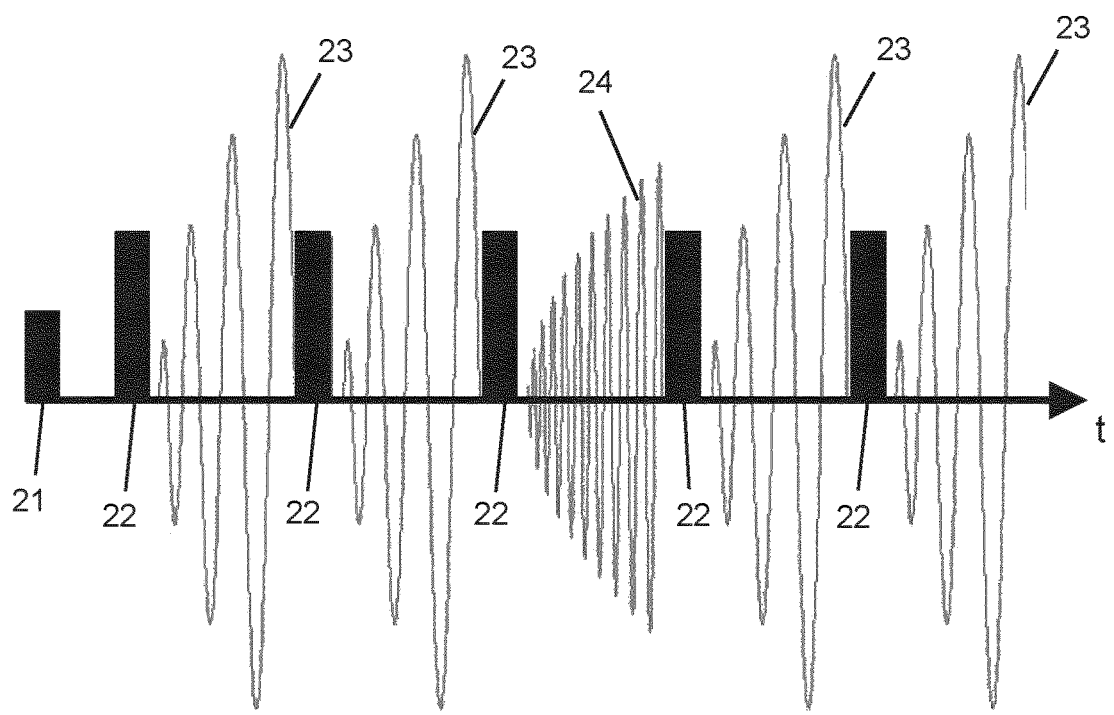
FIG. 2 schematically illustrates the modified spiral FSE imaging sequence of the invention.
Figure 3:
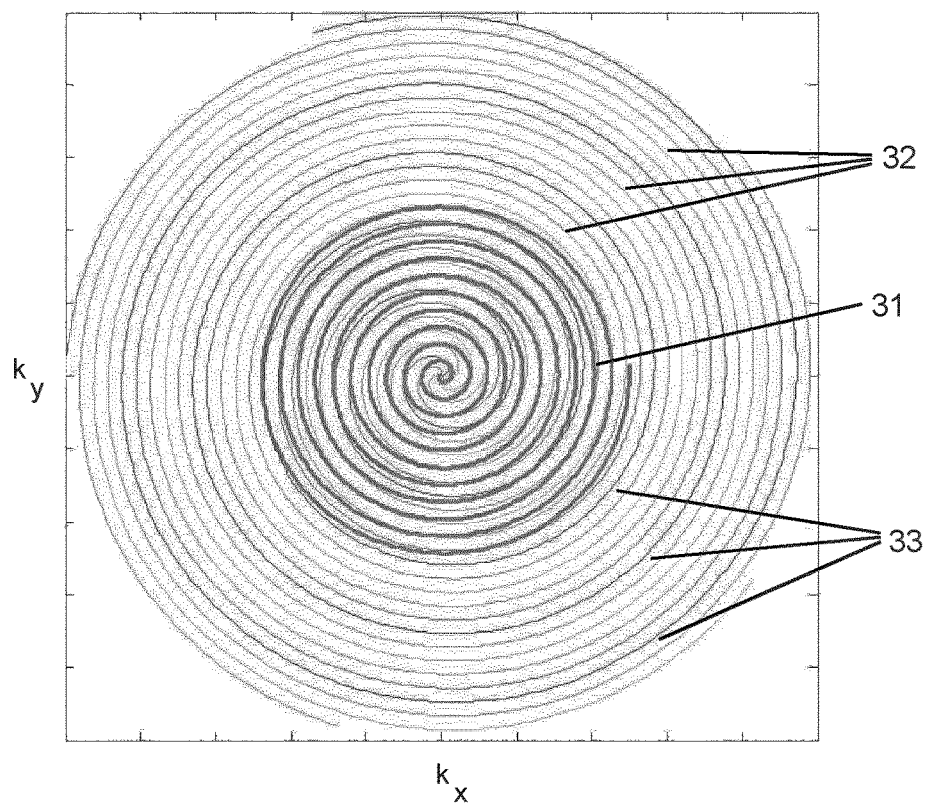
FIG. 3 shows a diagram of k-space schematically illustrating the spiral acquisition scheme of the invention in a first embodiment.
Figure 4:
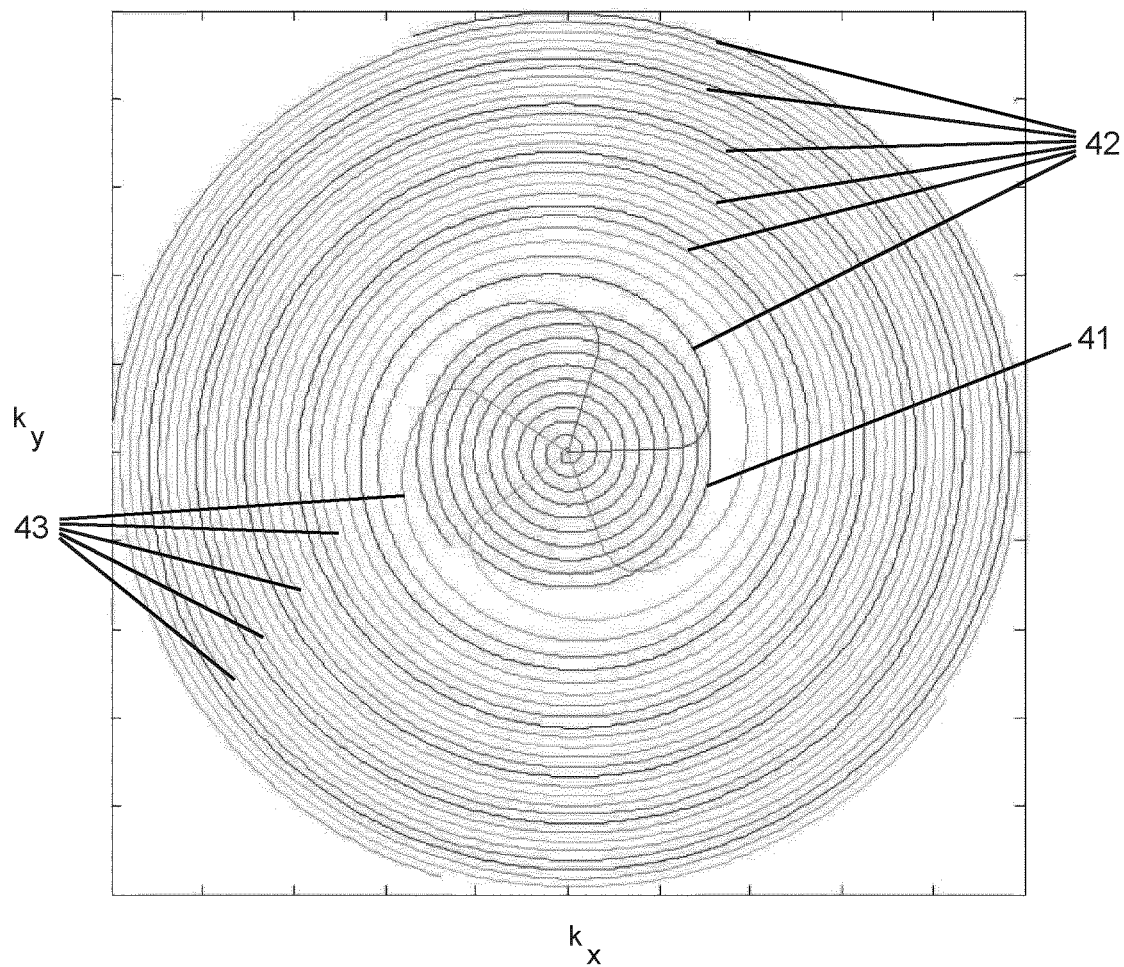
FIG. 4 shows a diagram of k-space schematically illustrating the spiral acquisition scheme of the invention in a second embodiment.

With continuing reference to FIG. 1 and with further reference to FIGS. 2-4, embodiments of the imaging approach of the invention are explained.

FIG. 2 schematically illustrates the imaging sequence used according to the invention. For simplicity, only the RF pulses (black blocks) and the readout magnetic field gradient in the x-direction (oscillating signals) are shown. FIG. 2 shows a part of one shot of the imaging sequence which is a modified FSE sequence. The shot begins with a 90° RF excitation pulse 21, followed by a number of 180° RF refocusing pulses 22. To acquire the generated train of spin echoes in the intervals between successive refocusing pulses 22 along spiral k-space trajectories, sinusoidally modulated readout magnetic field gradients 23, 24 are applied. As can be seen, the amplitude of the gradient oscillations continuously increases in each interval from zero which means that the acquisition starts at the k-space origin and winds around the k-space origin with increasing radial distance. The magnetic field gradient in the y-direction (not depicted) oscillates in the same fashion, but with a phase offset of 90°. The magnetic field gradient 24 oscillates at a higher frequency while the maximum gradient amplitude reached over the acquisition interval is smaller compared to magnetic field gradients 23.

The resulting spiral k-space sampling is illustrated in FIG. 3. The k-space trajectory 31 of the spin echo associated with readout magnetic field gradient 24 has a smaller rate of increase of the radial distance compared to the trajectories of the other spin echoes associated with spiral trajectories 32, 33. Simultaneously, the number of windings of trajectory 31 in the central k-space region is higher compared to the other trajectories covering the full k-space, i.e. both the central k-space region and the peripheral k-space region extending at a larger radial distance from the k-space origin than the central k-space region. Hence, trajectory 31 samples only the central k-space region, but at a higher density than each of trajectories 32, 33. The complete set of interleaved k-space spirals fully samples k-space at the required density corresponding to the desired field of view. FIG. 3 shows six interleaved spiral trajectories corresponding to six spin echo signals, while only trajectories 31, 32, 33 are designated by reference numbers for the sake of better clarity. The sampling of the central k-space region by trajectory 31 is exploited according to the invention to reconstruct an MR image with a well-defined $T_2$ weighting from the acquired signal data. To this end the recorded spin echo associated with trajectory 31 is given a stronger weight in the reconstruction than the other spin echoes.

In the embodiment shown in FIG. 4, the interleaved spiral trajectories 42, 43 of all but one spin echo each have a larger rate of increase of the radial distance in the central k-space region as compared to the peripheral k-space region. This gives trajectories 42, 43 an extra low sampling density in the central k-space region which is sampled at a high density only by trajectory 41. In this way, an MR image with a well-defined $T_2$ weighting can be reconstructed as the signal data in the central k-space region dominating the image contrast are associated with a single spin echo. This embodiment has the advantage that the k-space sampling density can be kept more or less constant over the whole k-space while the central k-space region is oversampled in the embodiment shown in FIG. 3.

The invention claimed is:

1. A method of magnetic resonance (MR) imaging of an object positioned in an examination volume of a MR device, the method comprising:
generating a number of spin echoes by subjecting the object to one or more shots of an imaging sequence, each shot comprising an RF excitation pulse followed by a number of RF refocusing pulses, wherein modulated readout magnetic field gradients are applied in each interval between successive RF refocusing pulses,
acquiring MR signal data, wherein each spin echo is recorded along a spiral trajectory in k-space which winds around the k-space origin with continuously varying radial distance, wherein the trajectory of at least one spin echo has a different rate of variation of the radial distance at least in a central k-space region compared to the trajectories of the other spin echoes, and
reconstructing an MR image from the acquired MR signal data.

2. The method of claim 1, wherein the trajectories form a set of interleaved spirals in k-space.

3. The method of claim 1, wherein the number of windings of the trajectory of the at least one spin echo in the central k-space region is higher compared to the trajectories of the other spin echoes.

4. The method of claim 3, wherein the trajectory of the at least one spin echo has a smaller rate of variation of the radial distance in the central k-space region than the trajectories of the other spin echoes.

5. The method of claim 3, wherein the trajectory of the at least one spin echo covers only the central k-space region, while the trajectories of the other spin echoes also cover a peripheral k-space region extending at a larger radial distance from the k-space origin than the central k-space region.

6. The method of claim 1, wherein the trajectories of all but the at least one spin echo have a larger rate of increase of the radial distance in the central k-space region than in the peripheral k-space region.

7. The method of claim 1, wherein the reconstructed MR image is $T_2$-weighted.

8. The method of claim 1, wherein the reconstructed MR image is $T_1$-weighted.

9. The method of claim 1, wherein the at least one recorded spin echo of which the k-space trajectory has a different rate of variation of the radial distance is weighted differently than the other spin echoes in the step of reconstructing the MR image.

10. A magnet resonance (MR) device including at least one main magnet coil for generating a uniform, static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing a MR image from the received MR signals, wherein the MR device is arranged to perform the following steps:
generating a number of spin echoes by subjecting the object to one or more shots of an imaging sequence, each shot comprising an RF excitation pulse followed by a number of RF refocusing pulses, wherein modulated readout magnetic field gradients are applied in each interval between successive RF refocusing pulses,
acquiring MR signal data, wherein each spin echo is recorded along a spiral trajectory in k-space which winds around the k-space origin with varying radial distance, wherein the trajectory of at least one spin echo has a different rate of variation of the radial distance at least in a central k-space region compared to the trajectories of the other spin echoes, and
reconstructing an MR image from the acquired MR signal data.

11. A computer program to be run on a magnetic resonance (MR) device, which computer program comprises instructions stored on a non-transitory computer readable medium such that when executed by a processor for the MR device performs a method comprising:
applying one or more shots of an imaging sequence, each shot comprising an RF excitation pulse followed by a number of RF refocusing pulses, wherein modulated readout magnetic field gradients are applied in each interval between successive RF refocusing pulses,
acquiring MR signal data, wherein each of a number of spin echoes is recorded along a spiral trajectory in k-space which winds around the k-space origin with varying radial distance, wherein the trajectory of at least one spin echo has a different rate of variation of the radial distance at least in a central k-space region compared to the trajectories of the other spin echoes, and
reconstructing an MR image from the acquired MR signal data.

\* \* \* \* \*